(12) United States Patent
Fukuda et al.

(10) Patent No.: US 9,824,950 B2
(45) Date of Patent: Nov. 21, 2017

(54) SEMICONDUCTOR DEVICE

(71) Applicant: FUJI ELECTRIC CO., LTD., Kawasaki-shi (JP)

(72) Inventors: Kyohei Fukuda, Matsumoto (JP); Tatsuo Nishizawa, Matsumoto (JP); Yuhei Nishida, Matsumoto (JP); Eiji Mochizuki, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/645,898

(22) Filed: Mar. 12, 2015

(65) Prior Publication Data
US 2015/0187671 A1    Jul. 2, 2015

Related U.S. Application Data

(63) Continuation of application No. PCT/JP2013/083553, filed on Dec. 16, 2013.

(30) Foreign Application Priority Data

Dec. 19, 2012    (JP) ................................ 2012-277174

(51) Int. Cl.
*H01L 23/31*    (2006.01)
*H01L 23/12*    (2006.01)
(Continued)

(52) U.S. Cl.
CPC .......... *H01L 23/3121* (2013.01); *H01L 23/12* (2013.01); *H01L 23/24* (2013.01);
(Continued)

(58) Field of Classification Search
CPC ............... H01L 23/3121; H01L 23/522; H01L 23/49548; H01L 23/12; H01L 23/28;
(Continued)

(56) References Cited

U.S. PATENT DOCUMENTS

2009/0051052 A1    2/2009   Yoshioda et al.
2009/0145526 A1*   6/2009   Arai .......................... H01F 1/16
                                                                148/512
(Continued)

FOREIGN PATENT DOCUMENTS

JP    10270629 A    10/1998
JP    10294024 A    11/1998
(Continued)

OTHER PUBLICATIONS

International Search Report issued in PCT/JP2013/083553, dated Mar. 25, 2014. English translation provided.

*Primary Examiner* — Shahed Ahmed
(74) *Attorney, Agent, or Firm* — Rossi, Kimms & McDowell LLP

(57) ABSTRACT

A semiconductor device according to the invention includes an insulating substrate including an insulating plate, a circuit pattern that is formed on a front surface of the insulating plate, and a radiator plate that is fixed to a rear surface of the insulating plate, a semiconductor chip that is fixed to the circuit pattern, an external lead terminal that is connected to a surface electrode of the semiconductor chip through a wiring line, a molding resin that covers the insulating substrate, the semiconductor chip, the wiring line, and the external lead terminal such that a rear surface of the radiator plate and a portion of the external lead terminal are exposed, and an anchor layer including a stripe-shaped concave portion which is formed in the circuit pattern by laser beam irradiation.

5 Claims, 7 Drawing Sheets

(51) Int. Cl.
*H01L 23/495* (2006.01)
*H01L 23/522* (2006.01)
*H01L 23/24* (2006.01)

(52) U.S. Cl.
CPC .. *H01L 23/49531* (2013.01); *H01L 23/49541* (2013.01); *H01L 23/49548* (2013.01); *H01L 23/49568* (2013.01); *H01L 23/49575* (2013.01); *H01L 23/522* (2013.01); *H01L 2224/48091* (2013.01); *H01L 2224/48137* (2013.01); *H01L 2924/19107* (2013.01)

(58) Field of Classification Search
CPC . H01L 2224/48091; H01L 2924/19107; H01L 23/24; H01L 23/49531; H01L 23/49541; H01L 23/49568; H01L 23/49575; H01L 2224/48137
USPC ........ 257/666, 703, 788, 783, 784; 438/112, 438/118, 122, 123, 124, 126, 127
See application file for complete search history.

(56) References Cited

U.S. PATENT DOCUMENTS

| | | | |
|---|---|---|---|
| 2009/0243097 A1* | 10/2009 | Koroku | H01L 21/561 257/737 |
| 2011/0298121 A1* | 12/2011 | Nishibori | H01L 23/24 257/713 |
| 2014/0041923 A1* | 2/2014 | Hisada | H05K 1/115 174/266 |

FOREIGN PATENT DOCUMENTS

| | | |
|---|---|---|
| JP | 2002083917 A | 3/2002 |
| JP | 2005183417 A | 7/2005 |
| JP | 2006156574 A | 6/2006 |
| JP | 2007287800 A | 11/2007 |
| JP | 2008294132 A | 12/2008 |
| JP | 2009049298 A | 3/2009 |
| JP | 2012069670 A | 4/2012 |

* cited by examiner

SINGLE
L=1mm

DOUBLE
L=2mm

TRIPLE
L=3mm

QUADRUPLE
L=4mm

QUINTUPLE
L=5mm

HATCH
L=10mm

SEMICONDUCTOR DEVICE

CROSS-REFERENCE TO RELATED APPLICATIONS

This application is a continuation of International Application No. PCT/JP2013/083553, filed on Dec. 16, 2013, which is based on and claims priority to Japanese Patent Application No. JP 2012-277174, filed on Dec. 19, 2012. The disclosure of the Japanese priority application and the PCT application in their entirety, including the drawings, claims, and the specification thereof, are incorporated herein by reference.

BACKGROUND OF THE INVENTION

1. Field of the Invention

The present invention relates to a semiconductor device covered with a molding resin.

2. Related Art

FIG. 8 illustrates a semiconductor device according to the related art. A semiconductor device 500 includes an insulating substrate 51, a semiconductor chip 52 which is fixed to an insulating substrate 51, a bonding wire 55 which has one end connected to a surface electrode 52a of the semiconductor chip 52, an external lead terminal 56 to which the other end of the bonding wire 55 is connected, and a molding resin 57 which covers (molds) these components.

An aluminum insulating substrate or a ceramic insulating substrate is used as an insulating plate 51b of the insulating substrate 51. A circuit pattern 51a which is a cooper film is formed on the front surface of the insulating plate 51b and the semiconductor chip 52 is bonded onto the circuit pattern 51a by a bonding material 58 such as solder. In addition, a radiator plate 59 for dissipating heat generated when the semiconductor device 500 is used is fixed to the rear surface of the insulating plate 51b. The bonding wire 55 is used to connect the surface electrodes 52a of the semiconductor chip 52 and another semiconductor chip 52 which is provided separately from the semiconductor chip 52. The bonding wire 55 is also used to connect the circuit pattern 51a and another external lead terminal 56 which is provided separately from the external lead terminal 56. In many cases, the external lead terminal 56 is a plate-shaped lead frame and is made of a cooper material with high workability and conductivity. In general, for example, an epoxy resin is used as the molding resin 57.

In the molding-resin-type semiconductor device 500, the adhesion between the external lead terminal 56 or circuit pattern 51a which is made of a conductive material, such as a cooper material, and the molding resin 57 which is, for example, an epoxy resin is not high. Therefore, in some cases, immediately after molding, the molding resin 57 peels off due to contraction. In addition, even though the peeling-off of the molding resin due to contraction immediately after molding is prevented, the molding resin is likely to peel off due to a difference in thermal expansion coefficient between the molding resin and the cooper material when there is a temperature variation in the usage environment of the semiconductor device 500. In a semiconductor device with high current capacity, the width of a lead frame forming the external lead terminal 56 is large and the peeling-off of the molding resin occurs remarkably.

As a method for preventing the peeling-off of the molding resin, for example, there is a method illustrated in FIG. 9. That is, an anchor hole 61 which is a through hole is formed in an end portion of the external lead terminal 56 which is a lead frame. Then, the anchor hole 61 is filled with the molding resin 57 and a molding resin 57a and a molding resin 57b which are respectively arranged on the upper and lower sides of the external lead terminal 56 are connected to each other through the anchor hole 61. Therefore, an anchoring effect is exhibited and the adhesion between the molding resin 57 and the external lead terminal 56 is improved. As a result, the molding resin 57 is prevented from peeling off.

For example, in the method illustrated in FIG. 10, a conductor piece is provided as an anchor member 62 on an external lead terminal 56 which is a lead frame. Since the anchor member 62 is provided, the adhesion between the external lead terminal 56 and a molding resin 57 is improved and the molding resin 57 is prevented from peeling off.

In addition, there is a structure in which a plurality of concave portions are also formed in the circuit pattern 51a or the conductive piece is also provided as the anchor member on the circuit pattern 51a, in order to prevent the peeling-off of the molding resin.

For example, Japanese Patent Application Publication No. JP 2007-287800 A (also referred to herein as "Patent Document 1") discloses a semiconductor device which includes an insulating substrate, a semiconductor chip, a bonding wire, a lead frame, a molding resin, and a lead frame having a concave portion formed in the surface thereof in order to prevent the molding resin from peeling off.

Japanese Patent Application Publication Nos. JP 2002-83917 A (also referred to herein as "Patent Document 2") and JP 10-270629 A (also referred to herein as "Patent Document 3") disclose a technique which performs etching or rolling on the surface of a material used for a lead frame to roughen the surface, thereby preventing a molding resin from peeling off.

Japanese Patent Application Publication No. JP 2005-183417 A (also referred to herein as "Patent Document 4") discloses a technique which forms a structure which functions as an anchor member, that is, an aluminum wire bonded by stitch bonding, a metal plate bonded by ultrasonic bonding, a coated adhesive, a sheared structure, or a squeezed structure, in the vicinity of a fixing portion between a lead frame and a bonding wire to improve adhesion strength to the lead frame, thereby preventing the molding resin from peeling off.

Japanese Patent Application Publication No. JP 2009-49298 A (also referred to herein as "Patent Document 5") discloses a semiconductor component in which an opening portion through which a portion of the surface of a semiconductor element is exposed is formed in a molding resin layer and an uneven portion is formed in the surface of the semiconductor element around the opening portion to prevent peeling-off or cracks at the interface between the semiconductor element and the edge of the opening portion in the molding resin layer.

However, in the method illustrated in FIG. 9 or the method disclosed in Patent Document 1, since the anchor hole or the concave portion (recessed portion) is provided, the cross-sectional area of the external lead terminal, which is a lead frame, is reduced. Therefore, when the amount of current which flows to the external lead terminal increases, there is a concern that heat will be generated from the external lead terminal 56, resulting in an increase in temperature.

In the method illustrated in FIG. 10 or the method disclosed in Patent Document 4, in some cases, the external lead terminal, which is a lead frame, is not partially bonded to the structure functioning as the anchor member due to thermal stress. When the non-bonded portion is generated, there is a concern that the molding resin 57 peels off from the non-bonded portion.

In the methods disclosed in Patent Documents 2 and 3, a surface roughening process is performed on the surface of the material used for the lead frame using etching or rolling in order to obtain the anchoring effect. However, the effect of preventing the molding resin from peeling off is not sufficient.

In the method disclosed in Patent Document 5, since the uneven portion is formed in the surface of the semiconductor element, there is a concern that the uneven portion will have an effect on the performance of the semiconductor element.

SUMMARY OF THE INVENTION

The invention has been made in order to solve the above-mentioned problems and an object of the invention is to provide a semiconductor device which can improve the adhesion of a molding resin to prevent the molding resin from peeling off.

In order to achieve the object, a semiconductor device according to an aspect of the invention includes: an insulating substrate including an insulating plate, a circuit pattern that is formed on a front surface of the insulating plate, and a radiator plate that is fixed to a rear surface of the insulating plate; a semiconductor chip that is fixed to the circuit pattern; an external lead terminal that is connected to a surface electrode of the semiconductor chip through a wiring line; a molding resin that covers the insulating substrate, the semiconductor chip, the wiring line, and the external lead terminal such that a rear surface of the radiator plate and a portion of the external lead terminal are exposed; and an anchor layer including a stripe-shaped concave portion which is formed in the circuit pattern by laser beam irradiation.

The semiconductor device according to the above-mentioned aspect of the invention may further include an anchor layer including a stripe-shaped concave portion which is formed in the external lead terminal by the laser beam irradiation.

In the semiconductor device according to the above-mentioned aspect of the invention, a relationship between a surface roughness RMS of the anchor layer and a moving length L of the laser beam irradiation per unit area in the anchor layer may satisfy the following Expression (1).

the surface roughness $RMS \geq 0.00175$ mm;

the moving length $L$ of the laser beam irradiation per unit area $\geq 1$ mm; and the surface roughness $RMS$ (mm)×the moving length (mm) of the laser beam irradiation per unit area (mm$^2$)$\geq 0.0175$. [Expression 1]

The molding resin may be an epoxy resin or a phenol resin.

The circuit pattern may be formed by a cooper film. The external lead terminal may be made of a cooper material. The wiring line may be a bonding wire or an extension portion of the external lead terminal which is directly connected to the semiconductor chip.

The semiconductor device according to the invention includes the anchor layer including the stripe-shaped concave portion which is formed in the circuit pattern formed on the front surface of the insulating plate by laser beam irradiation. Therefore, since the concave portion is filled with the molding resin, an excellent anchoring effect is obtained and the adhesion of the molding resin is improved. As a result, it is possible to prevent the molding resin from peeling off. In addition, since the surface roughness RMS of the anchor layer and the moving length of laser beam irradiation per unit area in the anchor layer are set to predetermined ranges, it is possible to effectively prevent the molding resin from peeling off.

BRIEF DESCRIPTION OF THE DRAWINGS

FIG. 1A is a main portion cross-sectional view and FIG. 1B is a plan view illustrating a main portion of a region in which a semiconductor chip 2 is provided on a circuit pattern 1a of an insulating substrate 1;

FIG. 2A) is a model cross-sectional view when a concave portion is formed by laser beam irradiation and FIG. 2B is a model cross-sectional view when a concave portion is formed by a method, such as etching, scribing, rolling, or a protrusion forming method, other than the laser beam irradiation;

FIG. 3A is a diagram illustrating a case in which the concave portion 4 is arranged so as to be inclined at an angle of 45° with respect to one side of the semiconductor chip 2, FIG. 3B is a diagram illustrating a case in which four concave portions 4 are provided so as to surround the semiconductor chip 2, and FIG. 3C is a main portion cross-sectional view taken along the line X-X of FIG. 3B;

FIG. 6A is a diagram illustrating a case in which one concave portion 4 surrounds the semiconductor chip 2, FIG. 6B is a diagram illustrating a case in which two concave portions 4 surround the semiconductor chip 2, FIG. 6C is a diagram illustrating a case in which three concave portions 4 surround the semiconductor chip 2, FIG. 6D is a diagram illustrating a case in which four concave portions 4 surround the semiconductor chip 2, FIG. 6E is a diagram illustrating a case in which five concave portions 4 surround the semiconductor chip 2, and FIG. 6F is a diagram illustrating a case in which the longitudinal direction of the concave portion 4 is inclined at an angle of 45°;

DETAILED DESCRIPTION

Hereinafter, embodiments of the invention will be described with reference to the drawings.

Figure 1A:
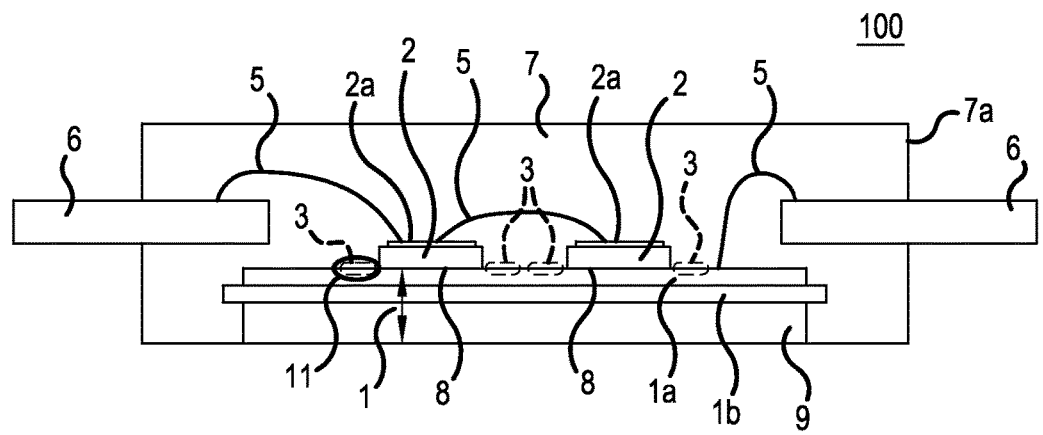
FIGS. 1A and 1B are diagrams illustrating the structure of a semiconductor device 100 according to a first embodiment of the invention.
Figure 1B:
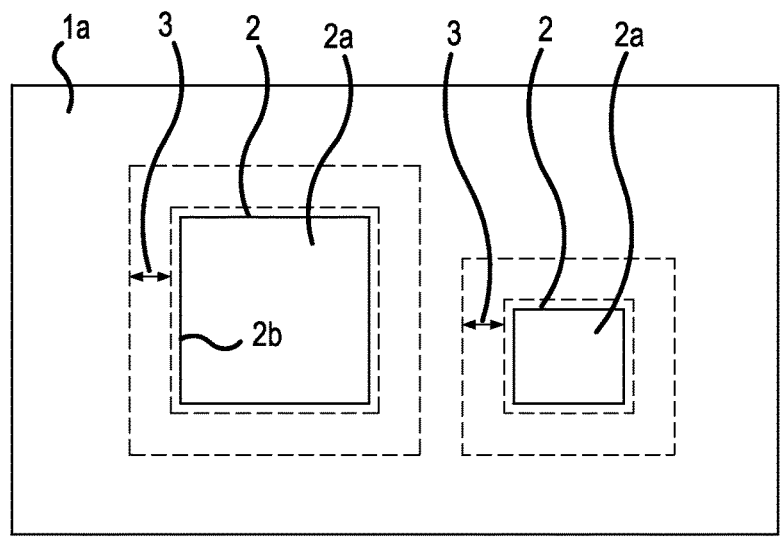

FIGS. 1A and 1B illustrate a semiconductor device according to a first embodiment of the invention. As illustrated in a main portion cross-sectional view of FIG. 1A, a semiconductor device 100 includes an insulating substrate 1, a semiconductor chip 2 which is fixed to the insulating substrate 1, a bonding wire 5 which has one end connected to a surface electrode 2a of the semiconductor chip 2, an external lead terminal 6 to which the other end of the bonding wire 5 is connected, and a molding resin 7 which covers (molds) these components.

For example, an aluminum nitride substrate or a ceramic substrate is used as an insulating plate 1b of the insulating substrate 1 and a circuit pattern 1a which is made of a conductive material is formed on the front surface of the insulating plate 1b. The circuit pattern 1a is formed by, for example, a cooper film. A rear surface electrode of the semiconductor chip 2 is bonded to the circuit pattern 1a by a bonding material 8, such as solder, and a radiator plate 9 for dissipating heat generated when the semiconductor device 100 is used is fixed to the rear surface of the insulating substrate 1. The radiator plate 9 is, for example, a copper plate. The bonding wire 5 is also used to connect the surface electrodes 2a of the semiconductor chip 2 and another semiconductor chip 2 which is provided separately from the semiconductor chip 2. In addition, the bonding wire 5 is used to connect the circuit pattern 1a and another external lead terminal 6 which is provided separately from the external lead terminal 6.

For example, an epoxy resin or a phenol resin can be used as the molding resin 7. The molding resin 7 covers the insulating substrate 1, the semiconductor chip 2, the bonding wire 5, and the external lead terminal 6 such that the rear surface of the radiator plate 9 and a portion of the external lead terminal 6 are exposed. In this embodiment, the external lead terminal 6 is a plate-shaped lead frame and can be made of, for example, a cooper material with high workability and conductivity.

As illustrated in the main portion cross-sectional view of FIG. 1B, the semiconductor device 100 includes an anchor layer 3 includes a stripe-shaped concave portion that is formed in the circuit pattern 1a around the semiconductor chip 2 by laser beam irradiation. In this embodiment, the semiconductor chip 2 with a size of 2.5 mm×2.5 mm and the semiconductor chip 2 with a size of 1.5 mm×1.5 mm are fixed to the insulating substrate 1.

Figure 2A:
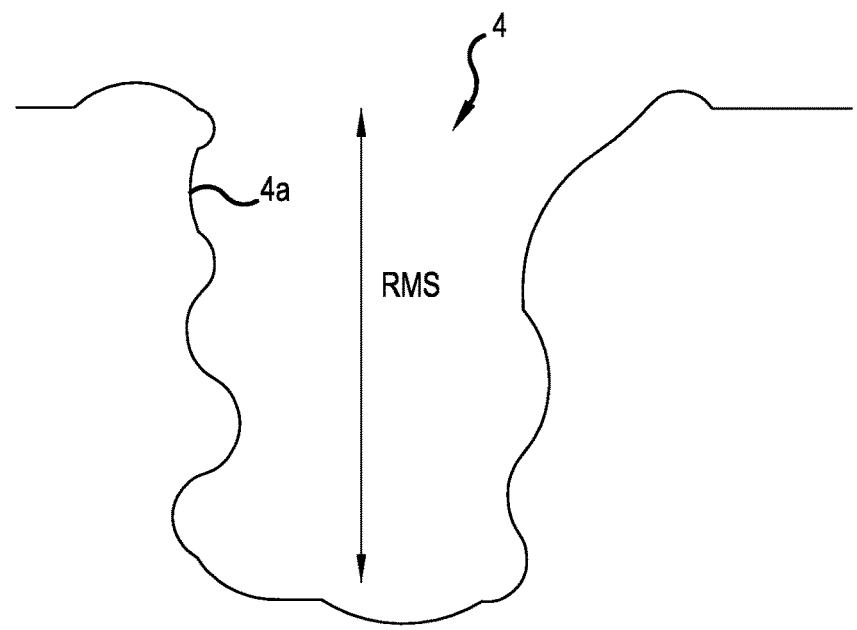
FIGS. 2A and 2B are cross-sectional views illustrating a main portion of an anchor layer 3.
Figure 2B:
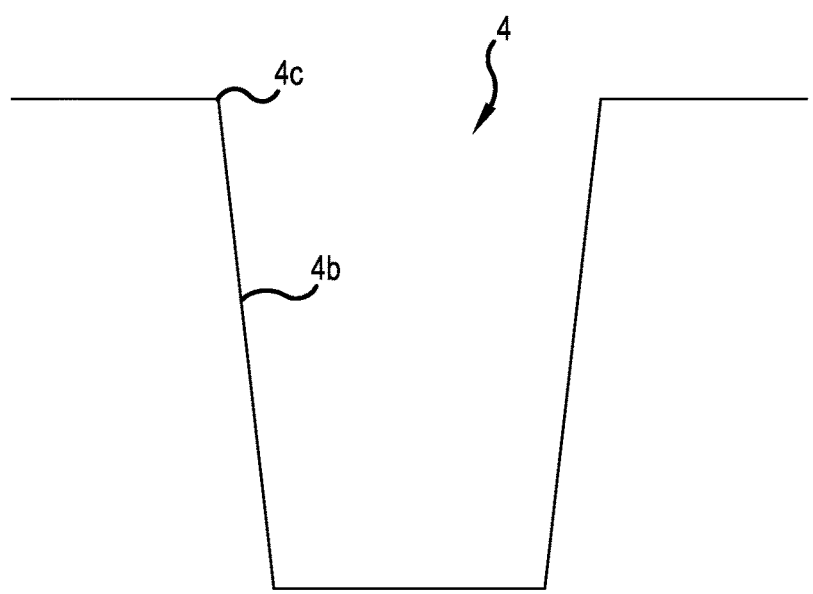

Next, the stripe-shaped concave portion which is formed by laser beam irradiation and forms the anchor layer 3 will be described with reference to FIGS. 2A and 2B. FIG. 2A is a cross-sectional view illustrating a model when a concave portion is formed by laser beam irradiation and FIG. 2B is a cross-sectional view illustrating a model when a concave portion is formed by a method, such as etching, scribing, rolling, or a protrusion forming method, other than the laser beam irradiation.

As illustrated in FIG. 2A, when a concave portion 4 is formed by laser beam irradiation, the unevenness (unevenness unique to the laser beam irradiation) of a side wall 4a of the concave portion 4 is relatively uniform since cooper is melted and scattered and the remaining copper is solidified. Therefore, stress is less likely to be concentrated on the side wall and peeling-off is less likely to occur due to a difference in thermal expansion coefficient. In addition, since the side wall 4a is smooth, but is uneven, the contact area of the side wall 4a with the molding resin 7 increases, which contributes to preventing the side wall from peeling off. In contrast, as illustrated in FIG. 2B, when a concave portion is formed by a method, such as etching, scribing, rolling, or a protrusion forming method, other than the laser beam irradiation, a corner 4c is formed on a cross line between the surface and a side wall 4b of a concave portion 4 and stress is likely to be concentrated on the concave portion. Therefore, peeling-off is likely to occur due to, for example, a difference in thermal expansion coefficient. In addition, since unevenness unique to the laser beam irradiation is not formed in the side wall 4b of the concave portion 4, the effect of increasing the contact area of the side wall with the molding resin 7 is not exhibited and a peeling prevention effect is insufficient.

Figure 3A:
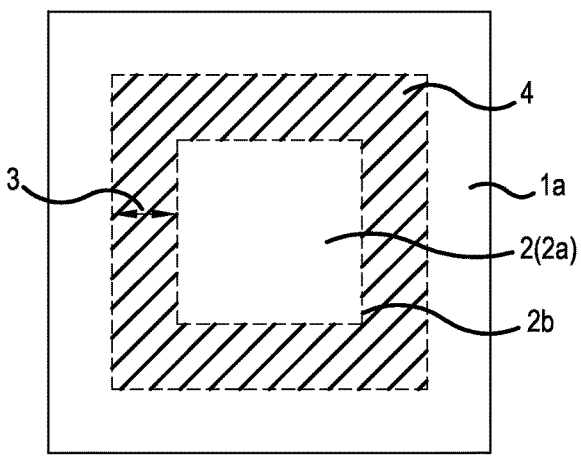
FIGS. 3A-3C are main portion cross-sectional views illustrating the arrangement of concave portions 4 in the anchor layer 3.
Figure 3B:
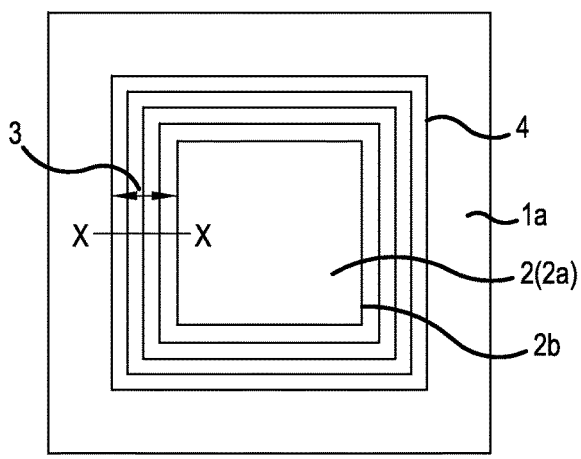
Figure 3C:
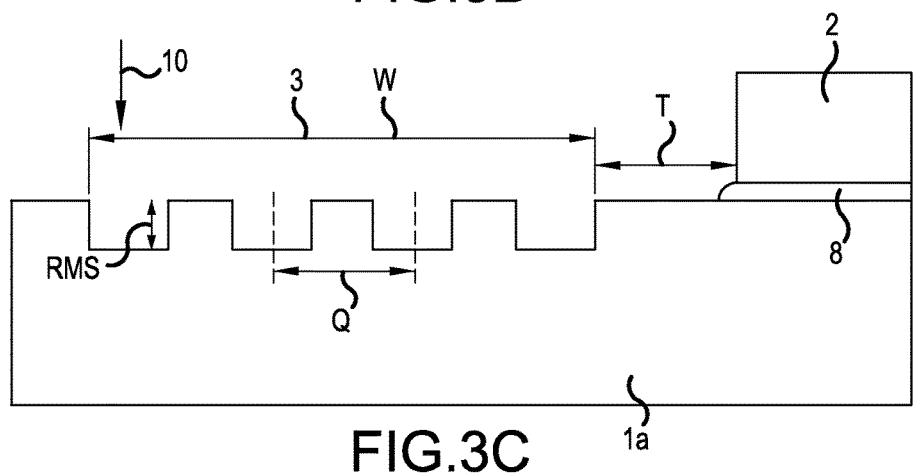

Next, the arrangement of the concave portions 4 forming the anchor layer 3 will be described with reference to FIGS. 3A-3C. The arrangement of the concave portions 4 is not particularly limited. However, the concave portions 4 are arranged as follows. As illustrated in FIG. 3A, the concave portion 4 may be arranged so as to be inclined at an angle of 45° C. with respect to one side of the semiconductor chip 2. Alternatively, as illustrated in FIG. 3B, the concave portion 4 may be arranged so as to surround the semiconductor chip 2. For example, it is preferable that a plurality of concave portions be formed substantially in parallel to each other at substantially equal intervals. In this case, it is possible to obtain the anchor layer 3 with uniform surface roughness RMS. FIGS. 3A and 3B illustrate the anchor layer 3 including the stripe-shaped concave portion which is formed in a straight shape by laser beam irradiation. However, the stripe-shaped concave portion may be formed such that a portion thereof is cut, or it may be formed in a dashed line shape or a curved line shape.

It is preferable that the anchor layer 3 including the concave portion 4 be formed in the circuit pattern 1a in the vicinity of or around the semiconductor chip 2. Internal stress is likely to be concentrated on a triple point 11 (see FIG. 1A) of the semiconductor chip 2, the circuit pattern 1a, and the molding resin 7 due to a difference in thermal expansion coefficient. According to this structure, it is possible to solve the problem of the internal stress and to effectively prevent the molding resin 7 from peeling off from the circuit pattern 1a.

The distance (which is represented by T in FIG. 3C) of the anchor layer 3 from an end portion 2b of the semiconductor chip 2 is preferably equal to or greater than 0.01 mm and equal to or less than 3 mm, more preferably equal to or greater than 0.05 mm and equal to or less than 2 mm, and most preferably about 0.1 mm. The preferred distance means the minimum distance in a direction straight to the end portion 2b of the semiconductor chip 2. The width (which is represented by W in FIG. 3C) of the anchor layer 3 is preferably equal to or greater than 0.5 mm and equal to or less than 10 mm, more preferably equal to or greater than 1 mm and equal to or less than 5 mm, and most preferably about 1 mm. The preferred width means a width in the direction straight to the end portion 2b of the semiconductor chip 2. The distance (which is represented by Q in FIG. 3C) between the centers of the concave portions 4 forming the anchor layer 3 is preferably equal to or greater than 0.01 mm and equal to or less than 2 mm, more preferably equal to or greater than 0.05 mm and equal to or less than 1 mm, and most preferably about 0.1 mm. The preferred distance between the centers corresponds to the distance between laser beam irradiation positions for forming the concave portions 4.

Figure 4:
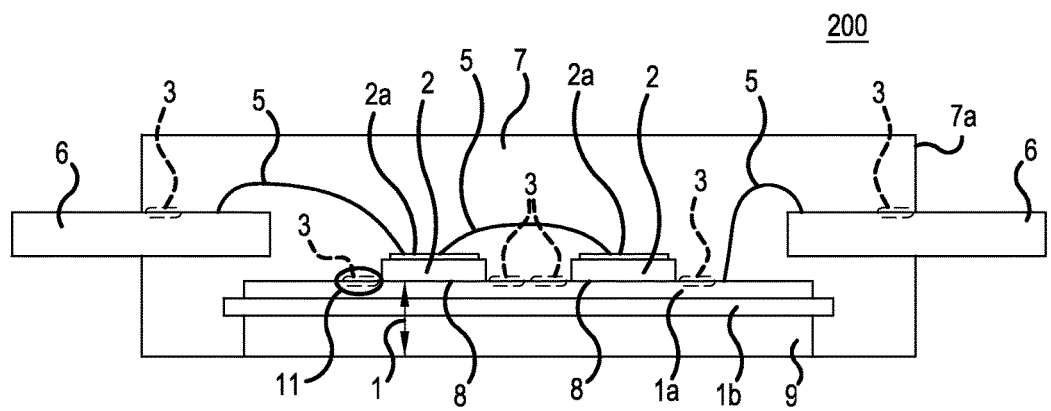
FIG. 4 is a cross-sectional view illustrating a main portion of a semiconductor device 200 according to a second embodiment of the invention.

FIG. 4 illustrates a semiconductor device according to a second embodiment of the invention. A semiconductor device 200 differs from the semiconductor device 100 in that an anchor layer 3 is formed in a circuit pattern 1a around a semiconductor chip 2 and is also formed in an external lead terminal in the vicinity of an end portion 7a of a molding resin 7. Internal stress is likely to be concentrated on a triple point 11 of the semiconductor chip 2, a circuit pattern 1a, and the molding resin 7 due to a difference in thermal expansion coefficient. According to this structure, it is possible to solve the concentration of the internal stress, to solve the concentration of stress due to a difference in thermal expansion coefficient between the molding resin 7 and the external lead terminal in the vicinity of the end portion 7a of the molding resin 7, and to effectively prevent the molding resin 7 from peeling off from the circuit pattern 1a or an external lead terminal 6. In particular, when the external lead terminal 6 has a large width (for example, 2.4 mm or more), the effect of the anchor layer 3 preventing the molding resin 7 from peeling off from the external lead terminal is further improved.

The distance of the anchor layer 3 from the end portion 7a of the molding resin 7 is preferably equal to or greater than 0.01 mm and equal to or less than 3 mm, more preferably equal to or greater than 0.05 mm and equal to or less than 2 mm, and most preferably about 0.1 mm. The preferred distance means the minimum distance in a direction straight to the end portion 7a of the molding resin 7, similarly to the distance (see T in FIG. 3C) of the anchor layer 3 from the end portion 2b of the semiconductor chip 2. The width of the anchor layer 3 formed in the external lead terminal is preferably equal to or greater than 0.5 mm and equal to or less than 10 mm, more preferably equal to or greater than 1 mm and equal to or less than 5 mm, and most preferably about 1 mm. The preferred width means a width in the direction straight to the end portion 7a of the molding resin 7, similarly to the width (see W in FIG. 3C) of the anchor layer 3 which is formed in the circuit pattern 1a around the semiconductor chip 2.

Figure 5:
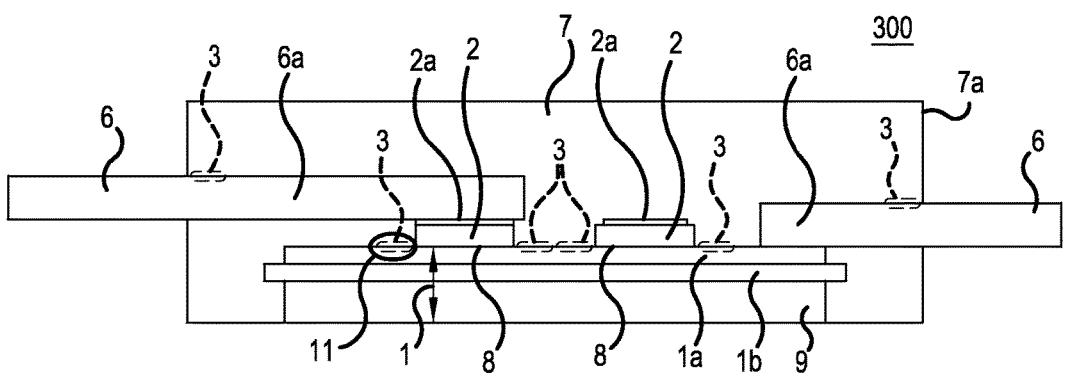
FIG. 5 is a cross-sectional view illustrating a main portion of a semiconductor device 300 according to a third embodiment of the invention.

FIG. 5 illustrates a semiconductor device according to a third embodiment of the invention. A semiconductor device 300 differs from the semiconductor device 100 or the semiconductor device 200 in that an external lead terminal 6 extends onto a semiconductor chip 2, instead of the bonding wire 5, and a surface electrode 2a of the semiconductor chip 2 is directly fixed to an extension portion 6a of the external lead terminal 6. This structure is preferable for a case in which the extension portion 6a of the external lead terminal 6 functions as the bonding wire 5 in the semiconductor device 100 or the semiconductor device 200 and current capacity is high. In this structure, similarly to the semiconductor device 100 or the semiconductor device 200, an anchor layer 3 is formed in a circuit pattern 1a around the semiconductor chip 2. Preferably, the anchor layer 3 is also formed in the external lead terminal 6. Therefore, it is possible to prevent a molding resin 7 from peeling off from the circuit pattern 1a or the external lead terminal 6.

According to an experimental example which will be described below, when the relationship between the surface roughness RMS of the anchor layer 3 and a moving length L of laser beam irradiation per unit area in the anchor layer 3 satisfies the following Expression (1), it is possible to effectively prevent the molding resin 7 from peeling off from the circuit pattern 1a or the external lead terminal 6.

the surface roughness RMS 0.00175 mm;

the moving length L of the laser beam irradiation per unit area≥1 mm; and the surface roughness RMS (mm)×the moving length (mm) of the laser beam irradiation per unit area (mm$^2$)≥0.0175. [Expression 1]

The surface roughness RMS corresponds to the depth of the concave portion 4 of the anchor layer 3 and is root-mean-square roughness. The moving length L of laser beam irradiation corresponds to the length of the stripe-shaped concave portion formed by laser beam irradiation. For example, when the stripe-shaped concave portion formed by laser beam irradiation has a dashed line shape, the total length of segments of the dashed line is the moving length L in laser beam irradiation.

The surface roughness RMS is measured by a laser microscope and a laser beam can be radiated to measure the surface roughness. In addition, the surface roughness RMS may be measured by a scanning probe microscope (SPM).

Figure 6A:
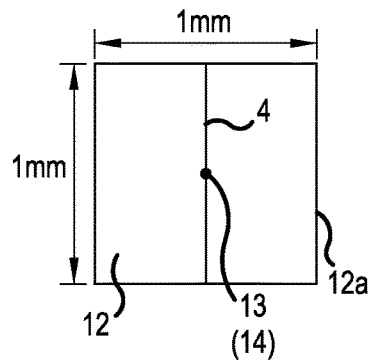
FIGS. 6A-6F are diagrams illustrating a method for calculating the moving length L of laser beam irradiation per unit area in the anchor layer 3.
Figure 6B:
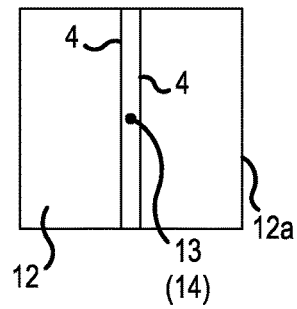
Figure 6C:
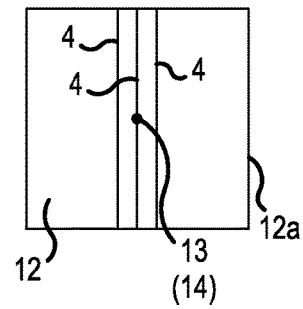
Figure 6D:
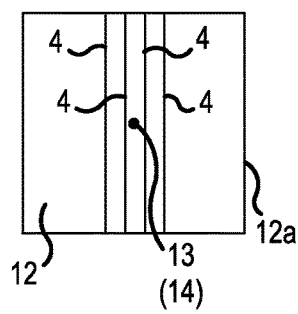
Figure 6E:
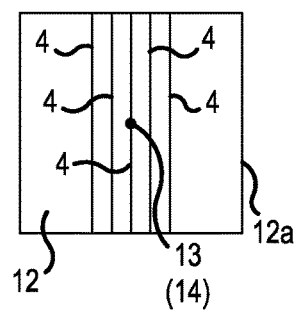
Figure 6F:
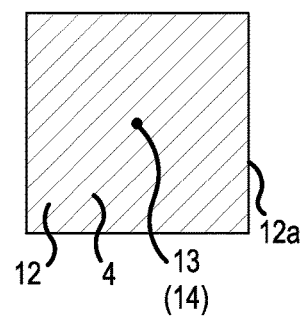

Next, a method of calculating the moving length L of laser beam irradiation per unit area in the anchor layer 3 will be described with reference to FIGS. 6A-6F. FIG. 6A is a diagram illustrating a case in which one concave portion 4 surrounds the semiconductor chip 2. FIG. 6B is a diagram illustrating a case in which two concave portions 4 surrounds the semiconductor chip 2. FIG. 6C is a diagram illustrating a case in which three concave portions 4 surrounds the semiconductor chip 2. FIG. 6D is a diagram illustrating a case in which four concave portions 4 surrounds the semiconductor chip 2. FIG. 6E is a diagram illustrating a case in which five concave portions 4 surrounds the semiconductor chip 2. FIG. 6F is a diagram illustrating a case in which the longitudinal direction of the concave portion 4 is inclined at an angle of 45°.

The moving length L of laser beam irradiation per unit area means the total length of the concave portions 4 in a square 12 of 1 mm$^2$. In FIG. 6A, L is 1 mm. In FIG. 6B, L is 2 mm. In FIG. 6C, L is 3 mm. In FIG. 6D, L is 4 mm. In FIG. 6E, L is 5 mm. In FIG. 6F, L is 10 mm. In this case, it is preferable that the moving length L of laser beam irradiation per unit area be a value when one side 12a of the square 12 is arranged in parallel to the end portion 2b of the semiconductor chip 2 or the end portion 7a of the molding resin 7. In addition, the moving length L of laser beam irradiation per unit area may be an average value when the center 13 of the square 12 of 1 mm$^2$ is moved to take a plurality of samples at an arbitrary measurement point 14 of the anchor layer 3.

EXAMPLES

The invention will be described in detail with reference to the following examples. However, these examples are not limited to the scope of the invention.

Experimental Example 1

The relationship between the moving speed of laser beam irradiation and the surface roughness RMS of the anchor layer 3 formed by laser beam irradiation was investigated. Laser irradiation was performed under the conditions that a current (related to laser beam intensity) that flowed through a light source generating a laser beam was 18 A and the frequency of laser beam irradiation was 5 kHz. The concave portions 4 of the anchor layer 3 were arranged such that a pitch Q between the concave portions 4 (corresponding to the distance between laser beam irradiation positions for forming the concave portions 4) was 0.1 mm, and the width W of the anchor layer 3 was 2 mm. The surface roughness RMS was measured by a laser microscope (product name "VK-8500" manufactured by KEYENCE CORPORATION) and was measured by measuring the surface roughness of a laser irradiation area. In addition, the width of an opening of the concave portion 4 was about 0.06 mm.

When the moving speed of laser beam irradiation was 8 mm/sec, 12 mm/sec, and 16 mm/sec, the surface roughness RMS was 0.0025 mm, 0.00175 mm, and 0.00125 mm, respectively. Data obtained from these three points showed that the surface roughness RMS was inversely proportional to the moving speed of laser beam irradiation. Therefore, it was considered that the moving speed of laser beam irradiation for obtaining the desired surface roughness RMS could be estimated using this relationship. For example, under the laser irradiation conditions, it was estimated that the moving speed of laser beam irradiation was preferably about 1.2 mm/sec in order to obtain a surface roughness RMS of about 0.0175 mm.

Experimental Example 2

Next, experiments conducted to derive the above-mentioned Expression (1) will be described.

As a sample of a semiconductor device for evaluating the effect of the anchor layer 3, a semiconductor device having the same structure as that illustrated in FIG. 1 was manufactured by fixing a semiconductor chip 2 with a size of 2.5 mm×2.5 mm and a semiconductor chip 2 with a size of 1.5 mm×1.5 mm to an insulating substrate 1 with a size of about 30 mm×13 mm, connecting the insulating substrate 1 and an external lead terminal 6 with a bonding wire 5 with a diameter ϕ of 0.3 mm, and sealing the components with an epoxy resin which was a molding resin 7.

As the anchor layer 3, four types of samples (samples H, I, J, and K) were manufactured under the same laser irradiation conditions as those in Experimental Example 1, that is, a surface roughness RMS of 0.00175 mm to 0.0175 mm and a moving length L of laser beam irradiation per unit area of 1 mm to 10 mm. Specifically, in each of the samples (H, I, J, and K), the surface roughness RMS were 0.00175 mm, 0.005 mm, 0.01 mm, and 0.0175 mm and the moving lengths L of laser beam irradiation per unit area were 10 mm, 3.5 mm, 1.75 mm, and 0.75 mm, respectively (see FIG. 7). The anchor layer 3 was formed in the circuit pattern 1a around the semiconductor chip 2 and the external lead terminal 6 so as to be 0.1 mm away from the end portion 2b of the semiconductor chip 2 and the end portion 7a of the molding resin 7. The arrangement of the concave portions 4 of the anchor layer 3 was the same as that illustrated in FIG. 3B. That is, a plurality of concave portions 4 were arranged so as to surround the semiconductor chip 2 and the width W of the anchor layer 3 was 2 mm. The width of an opening of the concave portion 4 was about 0.06 mm.

A heat shock test was performed at a high temperature of 125° C. for 10 minutes and is performed at a low temperature of −40° C. for 10 minutes. This process was repeatedly performed in 100 cycles. In addition, the peeling-off of the molding resin 7 was observed by an ultrasonic inspection method, similarly to the observation of voids by a usual method.

The result of the heat shock test provided that the molding resin 7 did not peel off and the effect of the anchor layer 3 was obtained in all of the samples (H, I, J, and K) in which the surface roughness RMS were 0.00175 mm, 0.005 mm, 0.01 mm, and 0.0175 mm the moving lengths L of laser beam irradiation per unit area were 10 mm, 3.5 mm, 1.75 mm, and 0.75 mm, respectively.

In general, the area of the side wall of the concave portion 4 in the anchor layer 3 which is formed by a laser beam is proportional to the value of the surface roughness RMS×the moving length L of laser beam irradiation. As the value increases, the frictional force between the molding resin 7 and the concave portion 4 formed by the laser beam increases. Therefore, the anchoring effect is improved and it is predicted that the peeling-off prevention effect will be improved.

Figure 7:
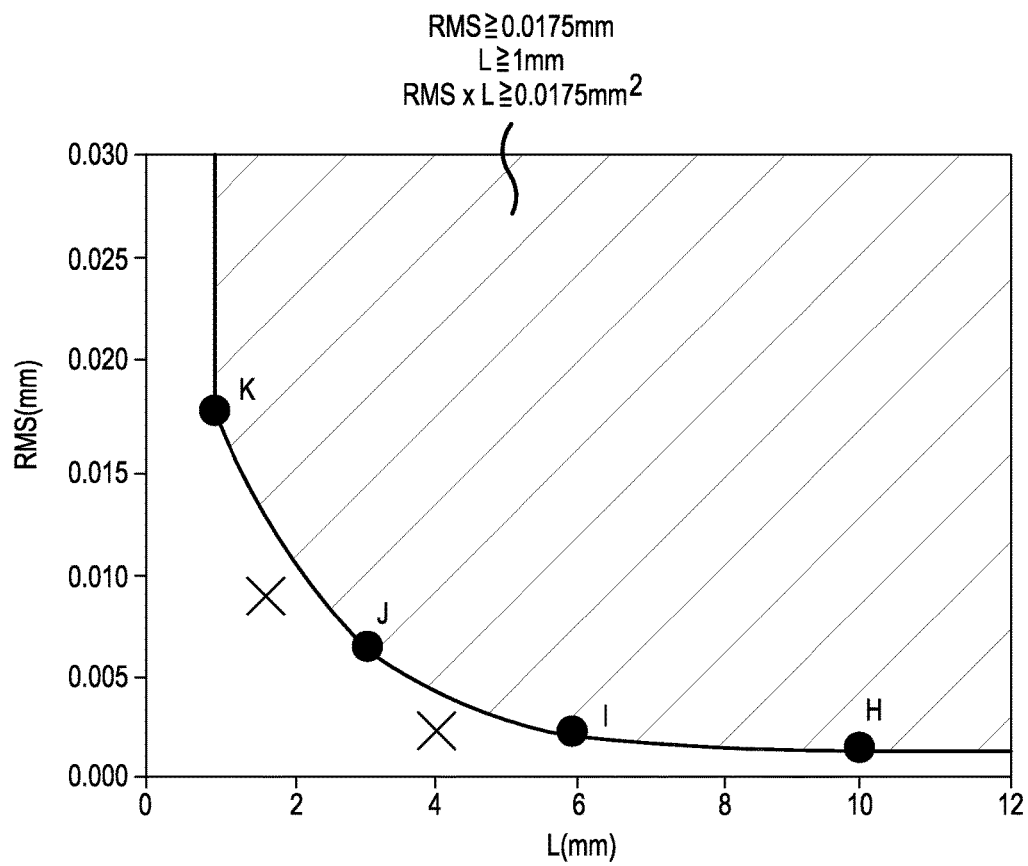
FIG. 7 is a graph illustrating a range in which a peeling-off prevention effect is exhibited, in which the X-axis indicates the moving length L of laser beam irradiation per unit area in the anchor layer and the Y-axis indicates the surface roughness RMS of the anchor layer.
Figure 8:
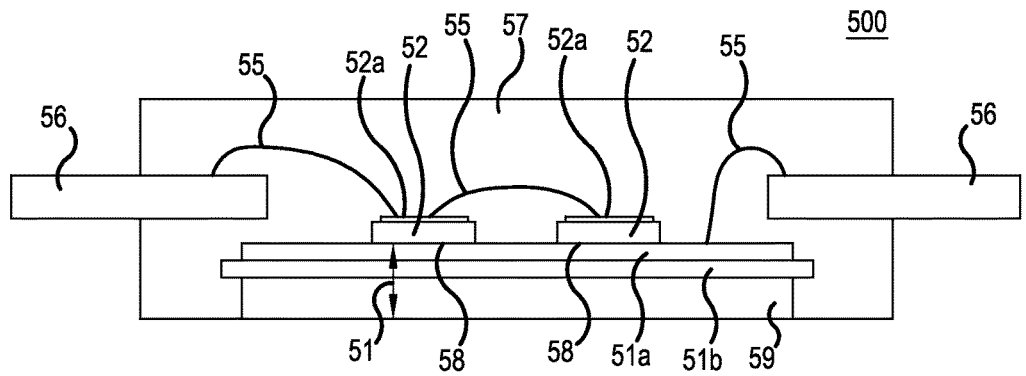
FIG. 8 is a cross-sectional view illustrating a main portion of a semiconductor device 500 according to the related art.
Figure 9:
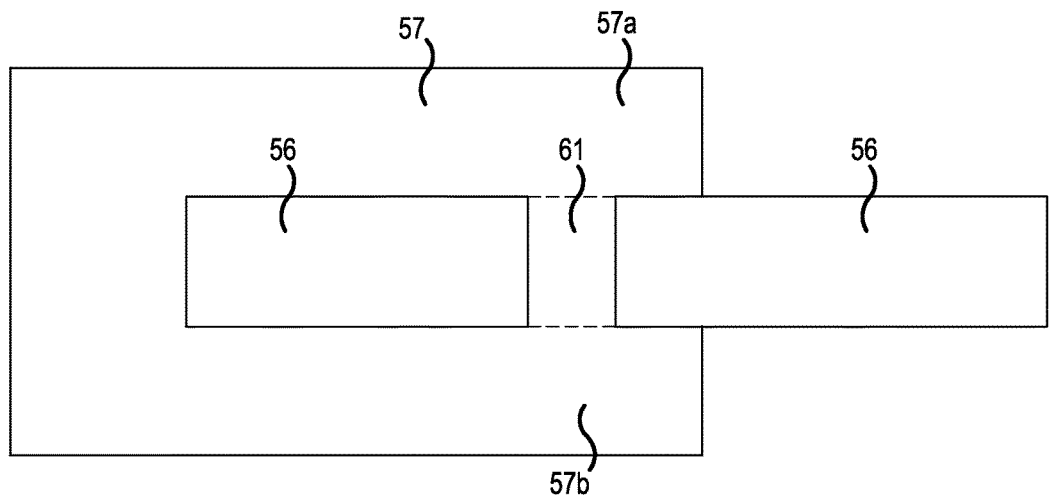
FIG. 9 is a cross-sectional view illustrating a main portion when an anchor hole 61 which is a through hole is formed in an external lead terminal 56 which is a lead frame and components are covered with a molding resin 57.
Figure 10:
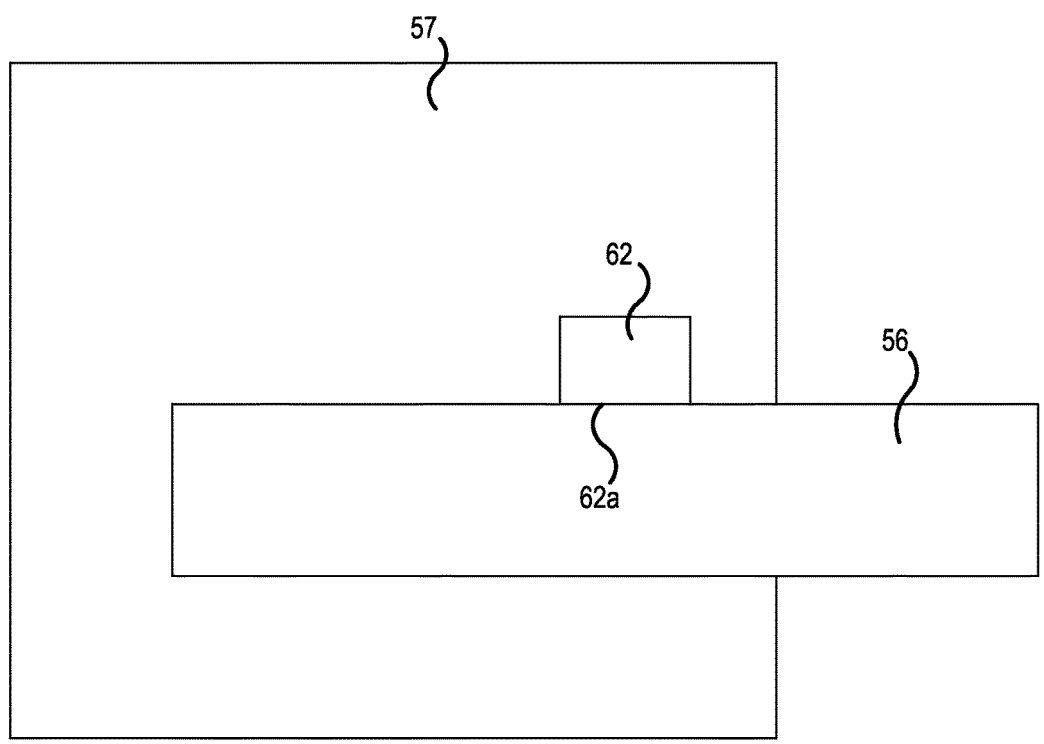
FIG. 10 is a cross-sectional view illustrating a main portion when a conductor piece is provided as an anchor member 62 in an external lead terminal 56 which is a lead frame and components are covered with a molding resin 57.

That is, in FIG. 7 which plots the moving length L of laser beam irradiation per unit area and the surface roughness RMS of each of the samples (H, I, J, and K), it is predicted that the peeling-off prevention effect will be improved in a range (hatched region) satisfying the above-mentioned Expression (1). This was supported by the result of another experiment which proved that the peeling-off prevention effect was not insufficient in a portion (for example, two x marks) out of the range illustrated in FIG. 4.

What is claimed is:

1. A semiconductor device comprising:
    an insulating substrate including an insulating plate, a circuit pattern that is formed on a front surface of the insulating plate, and a radiator plate that is fixed to a rear surface of the insulating plate;
    a semiconductor chip that is fixed to the circuit pattern;
    an external lead terminal that is connected to a surface electrode of the semiconductor chip through a wiring line;
    a molding resin that covers the insulating substrate, the semiconductor chip, the wiring line, and the external lead terminal such that a rear surface of the radiator plate and a portion of the external lead terminal are exposed; and
    an anchor layer including one or more stripe-shaped concave portions which are formed in the circuit pattern by laser beam irradiation,
    wherein a relationship between a surface roughness RMS of the anchor layer and a moving length L of the laser beam irradiation per unit area in the anchor layer satisfies the following expression:

the surface roughness $RMS \geq 0.00175$ mm;

the moving length $L$ of the laser beam irradiation per unit area $\geq 1$ mm;

the surface roughness $RMS$ (mm)×the moving length (mm) of the laser beam irradiation per unit area (mm$^2$)$\geq 0.0175$; and wherein the moving length L of the laser beam irradiation per unit area in the anchor layer is defined as a total length of the one or more concave portions in a square of 1 mm$^2$.

2. The semiconductor device according to claim 1, further comprising:
    an anchor layer including a stripe-shaped concave portion which is formed in the external lead terminal by the laser beam irradiation.

3. The semiconductor device according to claim 1, wherein the molding resin is an epoxy resin or a phenol resin.

4. The semiconductor device according to claim 1, wherein the circuit pattern is formed by a cooper film, the external lead terminal is made of a cooper material, and the wiring line is a bonding wire or an extension portion of the external lead terminal which is directly connected to the semiconductor chip.

5. A semiconductor device comprising:

an insulating substrate including an insulating plate, a circuit pattern that is formed on a front surface of the insulating plate, and a radiator plate that is fixed to a rear surface of the insulating plate;

a semiconductor chip that is fixed to the circuit pattern;

an external lead terminal that is connected to a surface electrode of the semiconductor chip through a wiring line;

a molding resin that covers the insulating substrate, the semiconductor chip, the wiring line, and the external lead terminal such that a rear surface of the radiator plate and a portion of the external lead terminal are exposed; and an anchor layer including one or more stripe-shaped concave portions which are formed in the circuit pattern by laser beam irradiation, wherein side walls of the concave portions are formed to include uneven surfaces unique to formation by laser beam irradiation, and wherein the stripe-shaped concave portions are arranged so as to be inclined at an angle of 45° with respect to one side of the semiconductor chip.

\* \* \* \* \*